United States Patent [19]

Khatibzadeh et al.

[11] Patent Number: 5,321,279
[45] Date of Patent: Jun. 14, 1994

[54] BASE BALLASTING

[75] Inventors: M. Ali Khatibzadeh, Plano; Wiliam U. Liu, Dallas, both of Tex.

[73] Assignee: Texas Instruments Incorporated, Dallas, Tex.

[21] Appl. No.: 973,520

[22] Filed: Nov. 9, 1992

[51] Int. Cl.$^5$ .............................................. H01L 29/72
[52] U.S. Cl. .................... 257/197; 257/580; 257/582; 257/542; 257/543
[58] Field of Search ............... 257/197, 582, 198, 580, 257/539, 540, 542, 543, 592

[56] References Cited

U.S. PATENT DOCUMENTS

| | | | |
|---|---|---|---|
| 3,766,449 | 10/1973 | Bruchez | 257/580 X |
| 3,977,020 | 8/1976 | Enzlin et al. | 257/582 X |
| 3,990,092 | 11/1976 | Yoshimura | 257/580 X |
| 4,417,265 | 11/1983 | Murkland | 257/580 X |
| 4,686,557 | 8/1987 | Mahrla | 257/580 X |
| 4,725,876 | 2/1988 | Kishi | 257/543 X |
| 5,111,269 | 5/1992 | Tsugaru | 257/582 |
| 5,132,764 | 7/1992 | Raktaroglu | 257/198 |

FOREIGN PATENT DOCUMENTS

| | | | |
|---|---|---|---|
| 55-165672 | 12/1980 | Japan | 257/580 |
| 2140204 | 11/1984 | United Kingdom | 257/540 |

OTHER PUBLICATIONS

Wang et al., "A 4 GHz High Power Transistor–Design and Reliability," Conference: 1973 IEEE G–MTT International Microwave Symposium (4–6 Jun. 1973), Digest of Technical Papers, Boulder, Colo. U.S.A., pp. 236–238.

Primary Examiner—William Mintel
Attorney, Agent, or Firm—Dana L. Burton; Richard A. Stoltz; James C. Kesterson

[57] ABSTRACT

Generally, and in one form of the invention a semiconductor device is presented comprising: a transistor comprising an emitter finger and a base finger; and a ballast impedance connected to the base finger. Other devices and methods are also disclosed.

10 Claims, 3 Drawing Sheets

BASE BALLASTING

FIELD OF THE INVENTION

This invention generally relates to base ballasting of transistors.

BACKGROUND OF THE INVENTION

Without limiting the scope of the invention, its background is described in connection with heterojunction bipolar transistors (HBTs), as an example.

The design of power HBTs requires electrical and thermal considerations. The thermal design of a power HBT is very critical to reliable operation of the device. HBT's have similar characteristics to Si bipolar in that the base-emitter junction voltage, $V_{BE}$, has a negative temperature coefficient.

The negative temperature coefficient of $V_{BE}$ gives rise to the possibility of "thermal runaway" condition (also known as "current hogging" or "hot-spot" formation) whereby due to emitter contact non-uniformity or non-uniform temperature profile, one emitter finger conducts progressively larger amounts of current. The formation of "hot-spots" is undesirable from a reliability standpoint.

SUMMARY OF THE INVENTION

Generally, and in one form of the invention a semiconductor device is presented comprising: a transistor comprising an emitter finger and a base finger; and a ballast impedance connected to the base finger.

Preferably the devices comprise a plurality of the transistors and the ballast impedances maximize uniformity of temperature in the emitter fingers. The ballast impedances may be of essentially the same impedance value or of uniform impedance value. The transistor may be a heterojunction bipolar transistor and the ballast impedances may be resistors. The device may be an amplifier, for example, a high power amplifier, and may be used in a cellular telephone.

BRIEF DESCRIPTION OF THE DRAWINGS

In the drawings.

Corresponding numerals and symbols in the different figures refer to corresponding parts unless otherwise indicated.

DETAILED DESCRIPTION OF PREFERRED EMBODIMENTS

Figure 1:
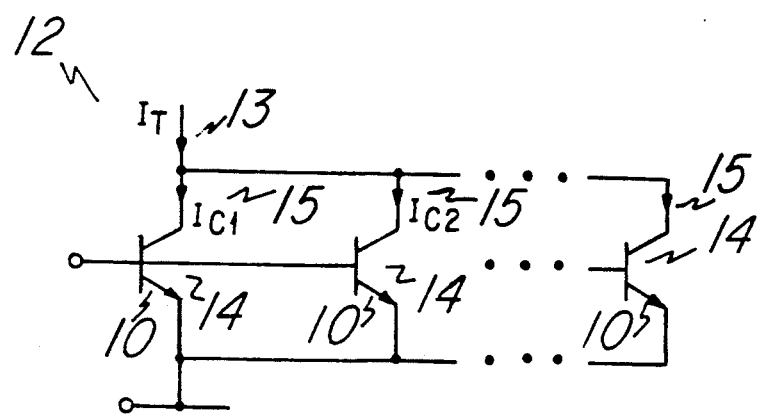
FIG. 1 is a partial electrical representation of a prior art device.

High power bipolar amplifiers often employ multi-finger structures to increase the total power output. Typically the emitter fingers 10 are laid out with each finger delivering a certain amount of current. The device 12 thus can be considered to consist of many sub-devices 14 connected together, with each sub-device 14 consisting of one emitter finger 10. The equivalent circuit diagram for the device 12 is shown in FIG. 1. During transistor (sub-device) 14 operation, power is dissipated as heat energy near the fingers 10, causing the temperature of each finger 10 to rise.

Figure 2:
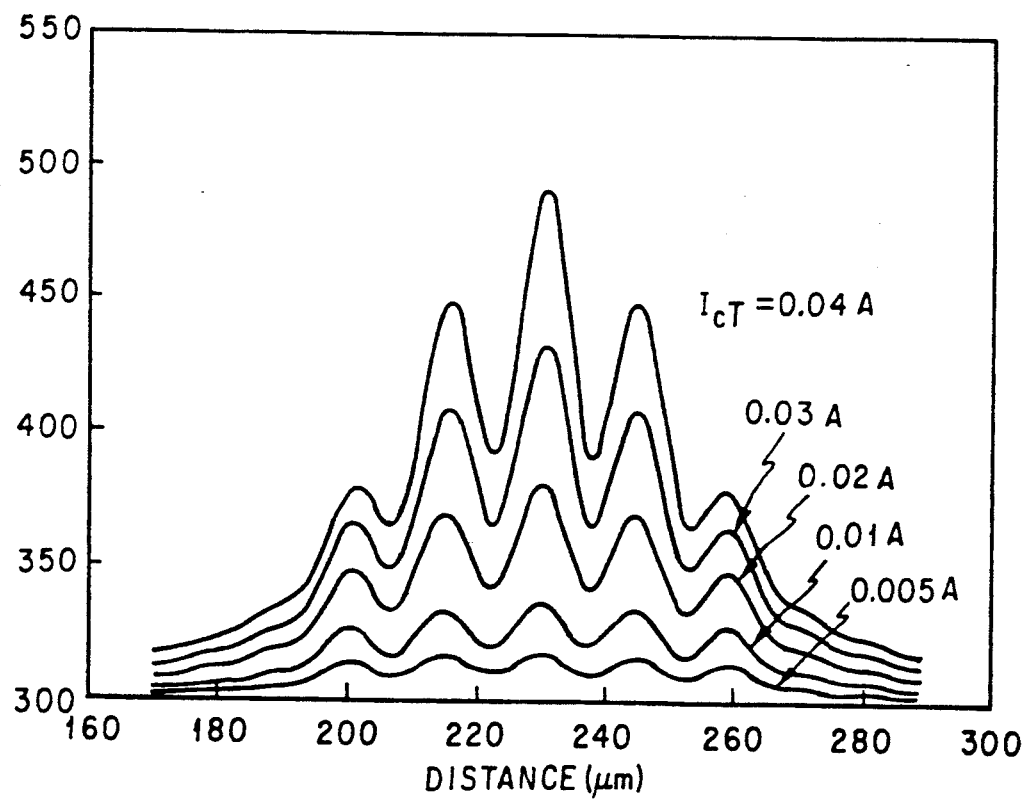
FIG. 2 is a typical temperature profile for a device like the one represented in FIG. 1.

A typical temperature profile for a 5-finger device having fingers 10 located at 200 μm, 215 μm, 230 μm, 245 μm, and 260 μm away from the edge of the wafer is shown in FIG. 2. The temperature profile is plotted as a function of total device current 13 (see FIG. 1). Referring to FIG. 2, the temperature is hottest for the center finger and coldest for the outermost fingers, especially when the device current 13 is large. Such a temperature profile in which the temperature varies from finger 10 to finger 10 is undesirable. When a finger 10 reaches a temperature high enough for a heat related failure mechanism (such as current hogging) to occur in that particular finger 10, the entire device 12 may fail. A more desirable temperature profile is one such that the temperature is fairly constant for all the fingers 10.

Figure 3:
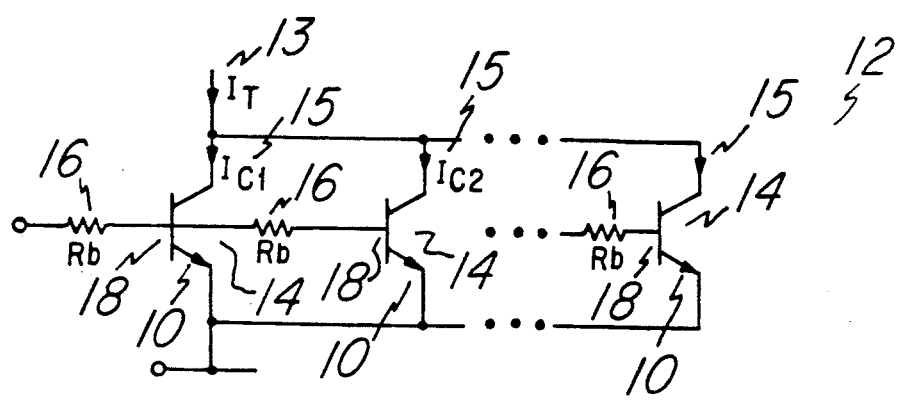
FIG. 3 is a partial electrical representation for a preferred embodiment of the present invention.

A preferred embodiment technique to maximize uniformity of temperature in the emitter fingers temperature profile utilizes base ballasting, preferably adding ballasting impedance such as resistors 16, at each of the bases 18, as shown in FIG. 3. When an impedance 16 is connected to the base 18 of a transistor 14 with a particular emitter finger 10, as that finger current 15 increases, the voltage drop across the ballasting impedance 16 increases and the available base-emitter junction voltage for that finger 10 decreases. Therefore, the finger current 15 at that finger 10 would decrease. The resultant negative feedback action brings about stability to individual fingers 10, therefore to the transistors 14, and consequently to the whole device 12.

The current corresponding to the onset of thermal runaway is given by:

$$I_{CRIT} = N\frac{kT_A}{q}\left[\frac{1}{\alpha R_{TH}V_{CE} - \frac{R_B}{(1+\beta)}}\right]$$

where:

$$\alpha \triangleq \left|\frac{\Delta V_{BE}}{\Delta T}\right|$$

$R_{TH}$ = Thermal impedance per unit finger
N = Number of emitter fingers
$V_{CE}$ = Collector-emitter voltage
$T_A$ = Ambient temperature
$\beta$ = Current gain
$R_B$ = Base resistance per unit finger In a second preferred embodiment, base ballast impedances 16 with varying impedances may be used at each of the base fingers 18 to maintain a relatively uniform temperature profile. Since the center finger is naturally hotter than the outer fingers, it is advantageous to increase the resistance value in the center finger to be higher than the resistances in the outer fingers. One method of implementation is to connect each finger 18 with a proper resistive material on or off the wafer. Therefore, the magnitude of base ballast impedances 16 can be identical for all of the fingers 18 or it can be tapered to improve the flatness of the temperature profile of the transistor 14.

In the past, in Si bipolar transistors, ballast resistors have been used in the emitter. Base ballasting is not generally an option for Si bipolar transistor because the base normally consists of a single diffused p-tub. Therefore, the base fingers are not electrically isolated. In HBTs the base fingers are generally electrically isolated allowing the possibility of base ballasting.

The base ballasting technique of the present invention offers many advantages. Some of the advantages offered by base ballasting, in HBTs, in particular over emitter ballasting, are described below. For example, the base current is much smaller than the emitter current, therefore the power dissipation in a base ballast resistor is lower than that in an emitter ballast resistor by a factor of $(1+\beta)$, where $\beta$ is the current gain of the HBT. This makes the base ballast resistor area smaller by a similar factor leading to compact layout.

Figure 4:
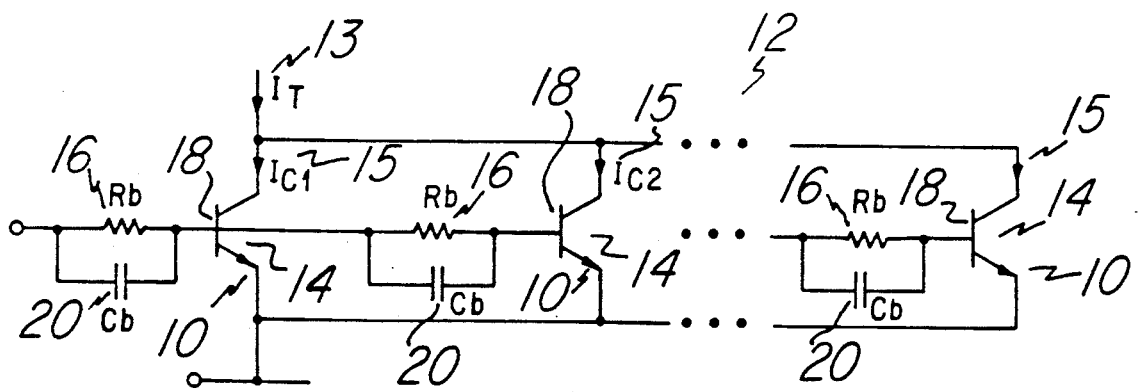
FIG. 4 is a partial electrical representation of an alternative embodiment of the present invention.

The magnitude of base ballast resistors are a factor of $(1+\beta)$ higher than the equivalent emitter ballast resistor, making them more compatible with existing technology such as thin-film resistors, TaN resistors as an example, commonly used in GaAs IC processing. A base ballast resistor with a value of $R_B$ is equivalent to an emitter ballast resistor of $R_E = R_B/(1+\beta)$. Since in HBTs it has been shown that B has a negative temperature coefficient, the higher the temperature of a single emitter, the lower it's current gain ($\beta$) and thus the higher it's effective ballast resistor value. This increases the ballasting (stabilization) effect of the ballast resistor. Since the magnitude of base ballast resistor is higher than the equivalent emitter ballast resistors, the size of other components may be smaller. For example, a bypass capacitor used to ensure minimum gain loss in the transistor is proportionally lower. This makes it feasible to use, as an example, metal-insulator-metal (MIM) capacitors 20, such as those made with SiN dielectric layers that are common to the GaAs IC processes, as shown in FIG. 4. This again leads to a very compact layout. As an example, a base-ballasted power HBT designed for operation at X-band(8-12 Ghz) with ballast resistor value of 200 ohms may have a corresponding by-pass capacitor of 0.4 pF per emitter finger. Both the resistor and the capacitor values lend themselves to a very compact layout. The equivalent emitter ballasted HBT (assuming $\beta=20$) would require an emitter ballast resistor of 10 ohms and corresponding capacitor of 8.0 Pf per emitter finger. Such values will make it impossible to implement the X-band HBT using GaAs IC processes.

Base ballasted HBTs demonstrate reduced tendencies to generate subharmonics. Base ballasting apparently reduces the HBTs tendency to generate negative resistance at subharmonic frequencies. Amplifier subharmonics are normally considered to be spurious signals. In many applications, spurious signal specifications can be difficult to meet. Base ballasted HBT amplifiers improve the ability to meet these specifications. A base ballasted HBT has improved low frequency electrical stability which is desirable from the circuit design point of view.

Base ballasting improves the linearity of HBTs in terms of reduced harmonics and intermodulation distortion. This is especially true in the case of microwave power applications. Harmonic level reductions of 5 to 10 Db or more have been measured for base ballasted HBTs in comparison to HBTs without base ballast resistors. Base ballasting linearizes the base-emitter junction characteristics which is a dominant source of nonlinearity in the HBT.

Figure 5:
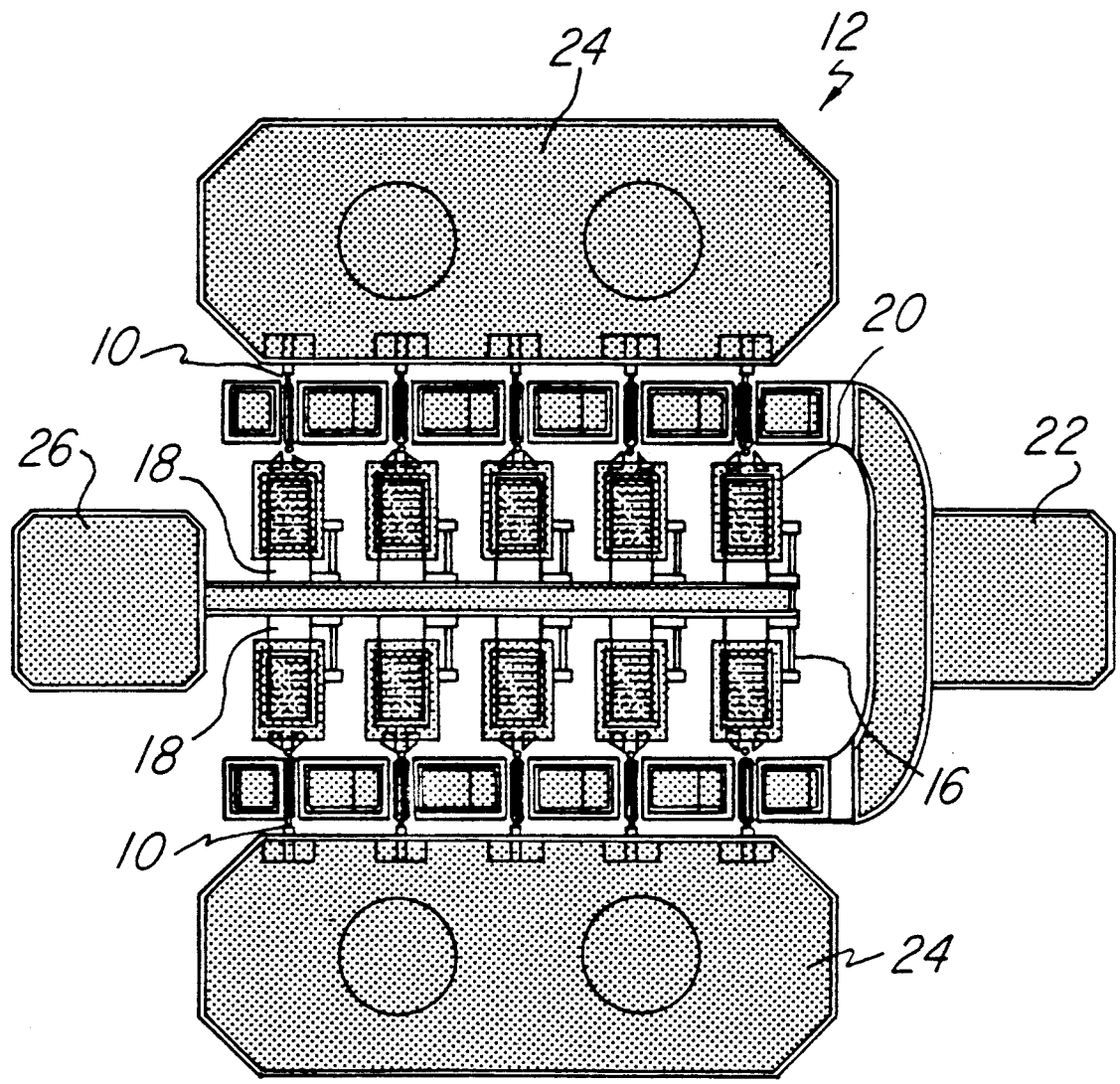
FIG. 5 is an example of a device layout incorporating the present invention.

An example layout of X-band base-ballasted power transistors 14 is shown in FIG. 5. In this particular example, there are ten emitter fingers 10, the ballast resistor 16 is 300 ohms and bypass capacitors 20 of 0.4 Pf are provided. The resistors may be fabricated from TaN and the capacitors may be made, for example, using a 2000 Å nitride MIM process. Also shown in FIG. 5 are the collector 22, the common emitter 24 connecting the individual emitter fingers 10 and the common base 26 connecting the individual base fingers 18.

The base ballasting approach may be used, for example, to solve instability problems of HBTs for cellular phone power amplifier applications. This technique may be applied to other products, such as those which utilize multi-finger power HBTs. Examples of specific uses of the present invention include X-band power amplifiers and X-band phased array applications.

Base ballasting allows for simultaneously achieving thermal equalization among HBT fingers without degradation in collector efficiency. This is very important for high-efficiency HBT power amplifier application in cellular phones and other wireless systems. The alternative method of ballasting (emitter ballasting) may adversely affect efficiency.

A preferred embodiment has been described in detail hereinabove. It is to be understood that the scope of the invention also comprehends embodiments different from those described, yet within the scope of the claims. Words of inclusion are to be interpreted as nonexhaustive in considering the scope of the invention.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A semiconductor device comprising:
   a. a heterojunction bipolar transistor comprising a plurality of emitter fingers and a plurality of base fingers; and
   b. a plurality of ballast impedances each having a first and second terminal, wherein said first terminal of each of said ballast impedances is connected to at least one of said base fingers and said second terminal of each of said ballast impedances is connected to a common base connection.

2. The device of claim 1, wherein said ballast impedances maximize uniformity of temperature in said emitter fingers.

3. The device of claim 1, wherein said ballast impedances are of essentially the same impedance value.

4. The device of claim 1, wherein said ballast impedances are not of uniform impedance value.

5. The device of claim 1, wherein said ballast impedances are resistors.

6. The device of claim 5, wherein said ballast resistors are TaN.

7. The device of claim 1, wherein said ballast impedances are resistors in parallel with capacitors.

8. The device of claim 1, wherein said device is an amplifier.

9. The device of claim 8, wherein said amplifier is a high power amplifier.

10. The device of claim 1, wherein said device is a portion of a cellular telephone.

* * * * *